United States Patent
Wan et al.

(10) Patent No.: US 9,386,203 B2
(45) Date of Patent: Jul. 5, 2016

(54) COMPACT SPACER IN MULTI-LENS ARRAY MODULE

(71) Applicant: OMNIVISION TECHNOLOGIES, INC., Santa Clara, CA (US)

(72) Inventors: Tsung-Wei Wan, Baoshan Township (TW); Wei-Ping Chen, New Taipei (TW); Jui-Yi Chiu, Zhubei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 10 days.

(21) Appl. No.: 14/064,813

(22) Filed: Oct. 28, 2013

(65) Prior Publication Data

US 2015/0116562 A1    Apr. 30, 2015

(51) Int. Cl.
*H04N 5/225* (2006.01)
*H01L 27/146* (2006.01)

(52) U.S. Cl.
CPC ........ *H04N 5/2254* (2013.01); *H01L 27/14627* (2013.01); *H04N 5/2252* (2013.01); *H01L 2224/48227* (2013.01)

(58) Field of Classification Search
None
See application file for complete search history.

(56) References Cited

U.S. PATENT DOCUMENTS

| | | | | |
|---|---|---|---|---|
| 6,384,397 B1* | 5/2002 | Takiar | ............... | H01L 27/14618 250/208.1 |
| 6,611,289 B1* | 8/2003 | Yu et al. | ........................ | 348/265 |
| 6,762,796 B1* | 7/2004 | Nakajoh | ........... | H01L 27/14618 348/340 |
| 7,092,174 B2* | 8/2006 | Yamaguchi | .............. | G02B 7/02 359/811 |
| 7,629,662 B2* | 12/2009 | Lee | ................................. | 257/440 |
| 7,901,973 B2* | 3/2011 | Yamamoto | ........ | H01L 27/14618 257/E31.127 |
| 8,023,016 B2* | 9/2011 | Iijima et al. | .................... | 348/265 |
| 8,208,210 B2* | 6/2012 | An | ......................... | G02B 7/021 359/668 |
| 8,440,488 B2* | 5/2013 | Tu | ..................... | H01L 27/14618 257/E27.001 |
| 8,670,055 B2* | 3/2014 | Tsujino | ......................... | 348/294 |
| 8,675,118 B2* | 3/2014 | Ryu | ............................... | 348/340 |
| 8,711,483 B2* | 4/2014 | Matsuno et al. | .............. | 359/620 |
| 9,118,825 B2* | 8/2015 | Singh | ..................... | G02B 7/021 |
| 2002/0027284 A1* | 3/2002 | Ono | .................. | H01L 27/14618 257/704 |
| 2002/0067416 A1* | 6/2002 | Yoneda et al. | ................. | 348/304 |
| 2003/0011888 A1* | 1/2003 | Cox et al. | ...................... | 359/626 |
| 2003/0071905 A1* | 4/2003 | Yamasaki | ..................... | 348/239 |

(Continued)

FOREIGN PATENT DOCUMENTS

TW    201323940 A1    6/2013

OTHER PUBLICATIONS

TW Patent Application No. 103124599—First Taiwanese Office Action, with Search Report and English Translation, issued Aug. 24, 2015, 15 pages.

(Continued)

*Primary Examiner* — Michael Osinski
(74) *Attorney, Agent, or Firm* — Blakely Sokoloff Taylor & Zafman LLP

(57) ABSTRACT

An apparatus includes an image sensor partitioned into N image sensor regions. The image sensor is attached to a circuit board. A lens array having including N lenses is disposed proximate to the image sensor. Each one of the N lenses is arranged to focus a single image onto a respective one of the N image sensor regions. A spacer structure is stacked between to the lens array and the circuit board to separate the lens array from the image sensor, wherein the spacer structure surrounds a perimeter around all of the N image sensor regions and N lenses such that none of the spacer structure is disposed between any of the N lenses and N image sensor regions of the image sensor.

18 Claims, 4 Drawing Sheets

(56) References Cited

U.S. PATENT DOCUMENTS

| | | | |
|---|---|---|---|
| 2005/0275746 A1* | 12/2005 | Nishida | G02B 7/02 348/360 |
| 2007/0008421 A1* | 1/2007 | Wu et al. | 348/340 |
| 2008/0007623 A1* | 1/2008 | Lee et al. | 348/207.99 |
| 2009/0034083 A1* | 2/2009 | Li et al. | 359/619 |
| 2009/0128672 A1* | 5/2009 | Watanabe | 348/273 |
| 2009/0147115 A1* | 6/2009 | Tanida | H01L 27/14618 348/294 |
| 2010/0117175 A1* | 5/2010 | Shizuno | 257/432 |
| 2010/0284089 A1* | 11/2010 | Shyu et al. | 359/622 |
| 2011/0057277 A1* | 3/2011 | Yu | 257/432 |
| 2011/0063487 A1 | 3/2011 | Yamada et al. | |
| 2011/0141309 A1* | 6/2011 | Nagashima et al. | 348/222.1 |
| 2011/0149143 A1* | 6/2011 | Tsujino | 348/374 |
| 2011/0285881 A1* | 11/2011 | Izuha et al. | 348/279 |
| 2012/0068288 A1* | 3/2012 | Hsin | H01L 27/14618 257/432 |
| 2012/0081587 A1* | 4/2012 | Ryu | 348/302 |
| 2012/0200728 A1* | 8/2012 | Kobayashi et al. | 348/222.1 |
| 2013/0341747 A1* | 12/2013 | Lin | H01L 31/0232 257/432 |
| 2014/0339668 A1* | 11/2014 | Arima | H01L 23/4006 257/443 |

OTHER PUBLICATIONS

TW Patent Application No. 1 031 24599—Second Taiwanese Office Action with English Translation, issued Mar. 24, 2016 (15 pages).

* cited by examiner

COMPACT SPACER IN MULTI-LENS ARRAY MODULE

BACKGROUND INFORMATION

1. Field of the Disclosure

The present invention relates generally to image sensors, and more specifically, to a lens array for a partitioned image sensor.

2. Background

An image capture unit typically includes an image sensor and an imaging lens. The imaging lens focuses light onto the image sensor to form an image, and the image sensor converts the light into electric signals. The electric signals are output from the image capture unit to other units in a host electronic system or a subsystem. The electronic system may be a mobile phone, a computer, a digital camera or a medical device.

As the use of image capture units in electronic systems increases, so do the demands for image capture unit features, capabilities and device dimensions. For example, image capture units are increasingly required to have lower profiles so that overall sizes of electronic systems including the image capture units can be reduced while at the same time not sacrifice quality in that optical images that are captured. The profile of an image capture unit may be associated with the distance from the bottom of image sensor to the top of the imaging lens.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figures 1A, 1B:
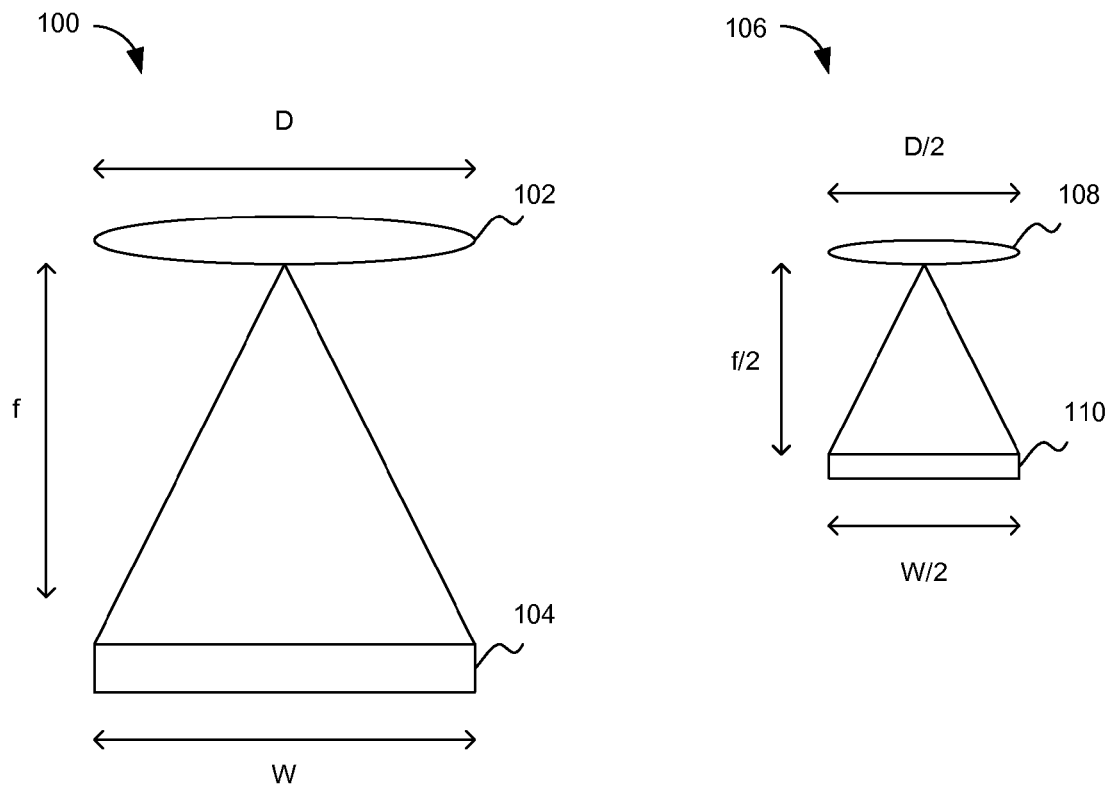
FIG. 1A is a schematic diagram of an image capture unit including an imaging lens and an image sensor.
FIG. 1B is a schematic diagram of a low profile image capture unit including a low profile imaging lens and an image sensor.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Example methods and apparatuses directed to a multi-lens array module including a compact spacer structure for use in a low profile image capture unit are disclosed. As will be appreciated, a multi-lens array module for use in a low profile image capture unit according to the teachings of the present invention may be provided, while the quality of optical images captured such as resolution (i.e., the number of pixels) and sharpness, is not sacrificed for the low profile in accordance with the teachings of the present invention.

To illustrate, FIG. 1A is a schematic diagram of an image capture unit 100 including an imaging lens 102 and an image sensor 104. The distance between lens 102 and image sensor 104 is approximately f, where f is the focal length of lens 102. The width of the image sensor 104 covered by lens 102 is W, and the lens diameter is D. For comparison, FIG. 1B shows a schematic diagram of a low profile image capture unit 106 including an imaging lens 108 and an image sensor 110. The distance between lens 108 and image sensor 110 is approximately f/2, where f/2 is the focal length of lens 108. The width of the image sensor 110 covered by lens 108 is W/2, and the lens diameter is D/2.

In a low profile image capture unit, the imaging lens is replaced with a low profile imaging lens, while the image sensor is unchanged. Image sensors 104 and 110 are the same image sensor, and both image sensors have the same pixel array structure. Since the width of image sensor 110 is half of the width of image sensor 104, image sensor 110 will have half of number of pixels as compared with image sensor 104 in one dimension. In two dimensions, image sensor 110 will have quarter of number of pixels as compared with image sensor 104. In other words, the number of pixels of the image captured is approximately proportional to the square of the scale of the distance between the lens and the image sensor.

Figure 2:
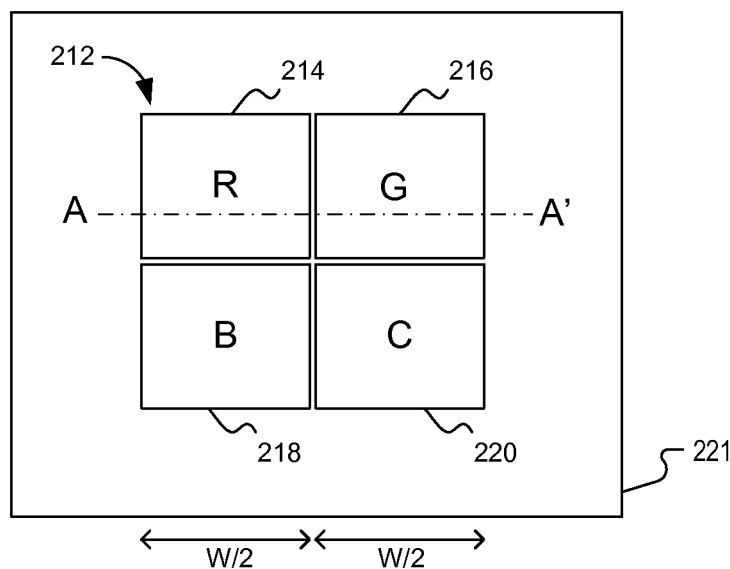
FIG. 2 illustrates a top down view of one example of an image sensor having four partitioned areas in accordance with the teachings of the present invention.

FIG. 2 illustrates an image sensor 212 having four partitioned areas 214, 216, 218, and 220 closely arranged proximate to each other on a circuit board 221 in accordance with the teachings of the present invention. As will be discussed in greater detail below, each partitioned area 214, 216, 218, and 220 is covered by a respective imaging lens in a multi-lens array module in accordance with the teachings of the present invention. In this manner, the focal length of each imaging lens in the multi-lens array module can be half of the imaging lens when the image sensor is not partitioned into four areas. Thus, a low profile image capture unit can be constructed using four lenses and four partitioned areas of an image sensor in accordance with the teachings of the present invention. The low profile image capture unit will have approximately the same resolution (i.e., the same number of pixels) as compared with the original image capture unit, because four areas of image sensor are used. An area of each partitioned area may be similar to image sensor 110 of FIG. 1B. In one example, partitioned areas 214, 216, 218, and 220 of image sensor 212 are designated to red (R), green (G), clear (C), and blue (B) areas, respectively.

Figure 3:
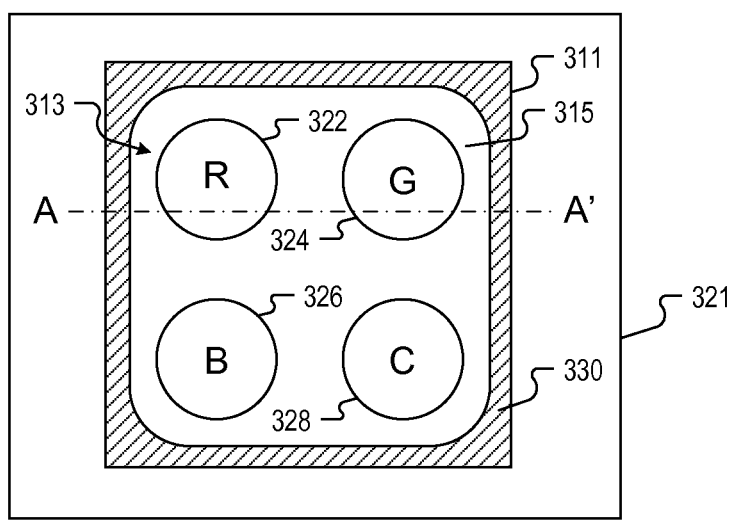
FIG. 3 illustrates a top down view of one example of a 2×2 multi-lens array module positioned over an image sensor having four partitioned areas in accordance with the teachings of the present invention.

FIG. 3 illustrates a top down view of one example of a 2×2 multi-lens array module 311 that is positioned over an image sensor having four partitioned areas mounted on a circuit board 321 in accordance with the teachings of the present invention. In one example, it is appreciated that the image sensor having the four partitioned areas mounted on circuit board 321 of FIG. 3 is one example of the image sensor 212 having the four partitioned areas 214, 216, 218, 220 that are mounted on circuit board 221 discussed above with respect to FIG. 2. Accordingly, it should be appreciated that similarly named and numbered elements referenced below are coupled and function as described above.

As shown in the example depicted in FIG. 3, multi-lens array module 311 includes a 2×2 lens array 313 including lenses 322, 324, 326, and 328 that are mounted to a spacer structure 330 over an image sensor having four partitioned areas mounted on a circuit board 321 in accordance with the teachings of the present invention. In one example, lenses 322, 324, 326, and 328 of lens array 313 are low profile lenses that are mounted to a glass wafer 315 attached to spacer structure 330, which is stacked between the lens array 313 and the circuit board 321. In one example, spacer structure 330 is adapted to separate the lens array 313 from the image sensor by a focal length of the lenses 322, 324, 326, and 328 in accordance with the teachings of the present invention. As shown in the illustrated example, the spacer structure 330 surrounds a perimeter around all of the partitioned areas of the image sensor and lenses 322, 324, 326, and 328 such that none of the spacer structure 330 is disposed between any of the lenses 322, 324, 326, and 328 and partitioned areas of the image sensor that is mounted on circuit board 321 in accordance with the teachings of the present invention. In one example, the spacer structure 330 is bonded directly on the circuit board 321 in accordance with the teachings of the present invention.

As shown in the depicted example, lenses 322, 324, 326, and 328 are designated to red (R), green (G), clear (C), and blue (B) areas, respectively. In other words, each one of the lenses 322, 324, 326, and 328, is arranged to focus a single image onto a respective one of red (R), green (G), clear (C), and blue (B) areas of image sensor regions, such as for example partitioned areas 214, 216, 218, and 220, respectively, of image sensor 212 as illustrated in FIG. 2. Thus, in one example, lens 322 forms a red image only, lens 324 forms a green image only, and lens 326 forms a blue image only. In addition, in one example, each one of the lenses 322, 324, 326, and 328 has a different respective radius of curvature that corresponds with the specific color of light that is being focused onto the corresponding image sensor region in accordance with the teachings of the present invention.

In contrast, a typical image capture unit uses a single imaging lens that forms red, green, and blue images simultaneously. However, since each lens 322, 324, 326, and 328 in accordance with the teachings of the present invention forms individually a single color image, the optical quality, e.g., sharpness, of each individual image may be improved by adjusting individually the radius of curvature of each lens and the corresponding image sensor. Thus, in one example, the radius of curvature of each one of the lenses 322, 324, 326, and 328 and the corresponding partitioned image sensor may be adjusted individually according to the wavelength of light, in order to get a high quality image in accordance with the teachings of the present invention. Accordingly, in one example, the radius of curvature of the red lens relative to the red area of the image sensor, the radius of curvature of the green lens relative to the green area of the image sensor, and the radius of curvature of the blue lens relative to the blue area of the image sensor are different in accordance with the teachings of the present invention. In one example, the radius of curvature of the C lens relative to the C area of the image sensor may adjusted to correspond with white light, or for example may be adjusted to correspond with green light.

Figure 4:
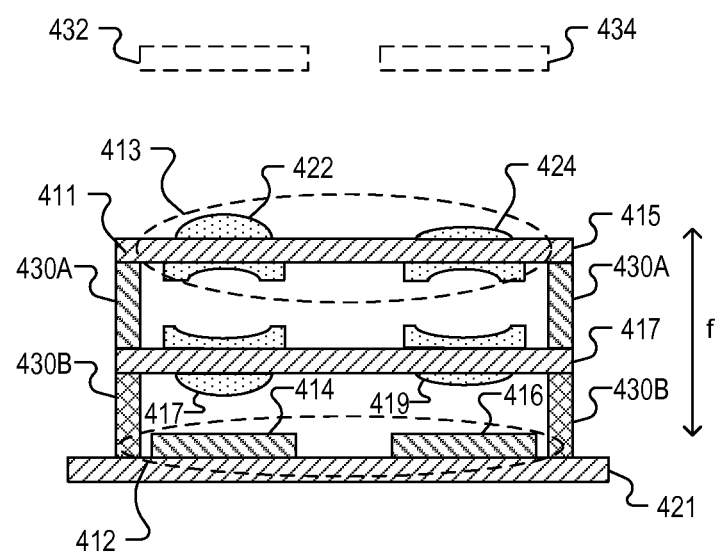
FIG. 4 is a cross-section illustrating two lenses of one example of a 2×2 multi-lens array module positioned over two partitioned areas of one example of a low profile image capture unit in accordance with the teachings of the present invention.

FIG. 4 is a cross-section illustrating two lenses 422 and 424 of a lens array 413 of an example 2×2 multi-lens array module 411 positioned over two partitioned areas 414 and 416 of an image sensor 412 of one example of a low profile image capture unit in accordance with the teachings of the present invention. In one example, the cross-section illustrated in FIG. 4 may correspond with dashed line A-A' of FIG. 2 and/or dashed line A-A' of FIG. 3. The partitioned areas 414 and 416 of image sensor 412 of FIG. 4 may be examples of areas 214 and 216 of image sensor 212 of FIG. 2. Similarly, lenses 422 and 424 of lens array 413 as well as spacer structure 430A of FIG. 4 may be examples of lenses 322 and 324 of lens array 313 as well as spacer structure 330, respectively, of FIG. 3. Accordingly, it should be appreciated that similarly named and numbered elements referenced below are coupled and function as described above.

As shown in example illustrated in FIG. 4, spacer structure 430A is adapted to separate lenses 422 and 424 of lens array 413 away from the partitioned areas 414 and 416 of image sensor 412 by a focal length f of the lenses 422 and 424 in accordance with the teachings of the present invention. In one example, the focal length f of lenses 422 and 424 and the width W of the partitioned areas 414 and 416 of image sensor 412 are half of the focal length of the lens 102 and half the width W of the image sensor 104 of FIG. 1A.

A typical image capture unit may include a Bayer type color filter array on the image sensor. In contrast, partitioned areas of image sensor 414 and 416 of FIG. 4 may not include Bayer type color filter array. Referring back to the example described above in FIG. 2, partitioned areas 214, 216, 218, and 220 may be designated to red (R), green (G), clear (C), and blue (B) areas, respectively. Thus, the red area may be covered by a single red filter, green area may be covered by a single green filter, blue area may be covered by a single blue filter, and clear or C area may not be covered by any filter or may be covered by a single clear filter or may be covered by a single green filter.

As shown in the example depicted in FIG. 4, the radius of curvature of lens 422 is different than the radius of curvature of lens 424. In one example, the radius of curvature of lens 422 with the focal length f corresponds with light having a first color, such as for example but not limited to red (R), and the radius of curvature of lens 424 with the focal length f corresponds with light having a second color, such as for example but not limited to green (G). Accordingly, a single image having the first color is focused by lens 422 onto partition area 414 of image sensor 412 and the same single image having the second color is focused by lens 424 onto partition 416 of image sensor 412 in accordance with the teachings of the present invention.

In one example, a single color filter may be disposed above each lens. Alternatively, a single color filter may be disposed between each lens and each partitioned area of a single image sensor. For example, as shown in the example depicted in FIG. 4, color filters 432 and 434 disposed above lens 422 and 424, respectively. Continuing with the example discussed above in which the radius of curvature of lens 422 corresponds with red (R) light and the radius of curvature of lens 424 corresponds with green (G) light, color filter 432 is a red (R) filter and color filter 434 is a green (G) filter.

Referring briefly back to the example depicted in FIG. 2, the red (R) area includes red pixels only, the green (G) area includes green pixels only, and the blue (B) area includes blue pixels only. The clear or C area may include white pixels when no filter is applied, and green pixels when a green filter is applied. A readout system and/or processor (not shown) may rearrange red, green, and blue pixels into Bayer pattern or any pattern for further processing the color signals and forming the color images. C pixels may be use as white pixels for particular processing or simply contribute as green pixels in accordance with the teachings of the present invention.

Referring back to the example of multi-lens array module 411 depicted in FIG. 4, lenses 422 and 424 of lens array 413 are low profile lenses that are mounted to a glass wafer 415 attached to spacer structure 430A, which is stacked between the lens array 413 and the circuit board 421. In one example, spacer structure 430A is adapted to separate the lens array 413 from the image sensor 412 by a focal length f of the lenses 422 and 424 in accordance with the teachings of the present invention. In one example, multi-lens array module 411 may also include lenses 417 and 419 mounted to a glass wafer 417, which is attached to spacer structure 430A and spacer structure 430B as shown. In one example, spacer structure 430A and 430B are substantially similar and are stacked as shown. Indeed, as shown in the illustrated example, the spacer structure 430A and the spacer structure 430B surround a perimeter around all of the partitioned areas of the image sensor and lenses 422, 424, 417, and 419 such that none of spacer structure 430A and none of spacer structure 430B is disposed between any of the lenses 422, 424, 417, and 419 and/or partitioned areas 414 and 416 of the image sensor 412 that is mounted on circuit board 421 in accordance with the teachings of the present invention. In one example, spacer structures 430A and 430B are bonded directly on the circuit board 421 as shown in accordance with the teachings of the present invention.

Figure 5:
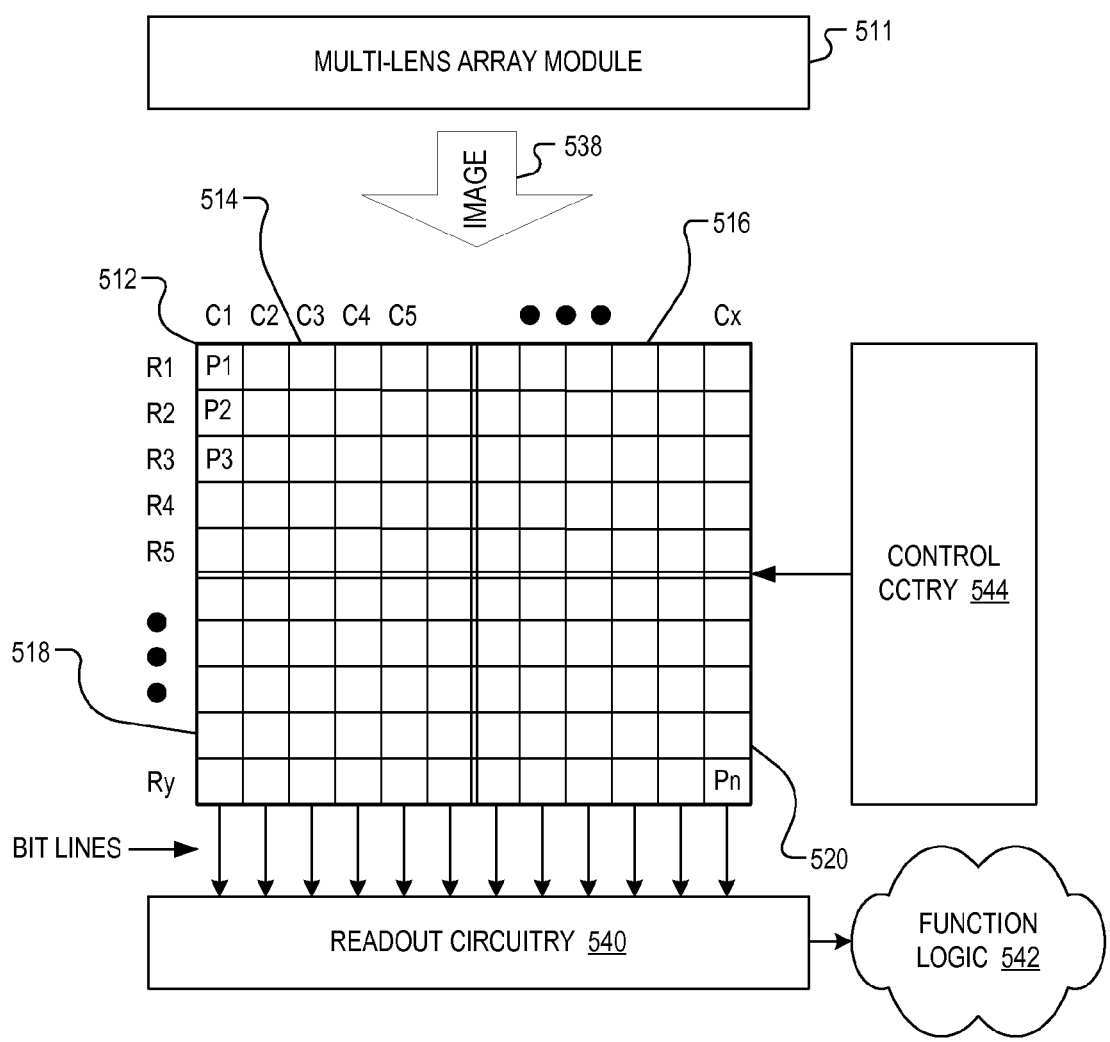
FIG. 5 is a block diagram illustrating one example of a portion of an image sensing system including a multi-lens array module positioned over an image sensor having partitioned areas in accordance with the teachings of the present invention.

FIG. 5 is a block diagram illustrating one example of a portion of an image sensing system 536 including a multi-lens array module 511 positioned over an image sensor 512 having partitioned areas 514, 516, 518, and 520 in accordance with the teachings of the present invention. In one example, it is appreciated that example multi-lens array module 511 of FIG. 5 is one example of multi-lens array module 311 of FIG. 3 or multi-lens array module 411 of FIG. 4, or that example image sensor 512 of FIG. 5 is one example of image sensor 212 of FIG. 2 or image sensor 412 of FIG. 4. Accordingly, it should be appreciated that similarly named and numbered elements referenced below are coupled and function as described above.

As shown in the example depicted in FIG. 5, imaging system 536 includes multi-lens array module 511 positioned over an image sensor 512, readout circuitry 540, function logic 542, and control circuitry 544. In the illustrated example, image sensor 512 is partitioned into four partitioned areas 514, 516, 518, and 520. In one example, each partitioned area 514, 516, 518, and 520 is covered by a color filter. In one example, multi-lens array module 511 includes a spacer structure, such as for example spacer structure 330 of FIG. 3, or spacer structures 430A and 430B of FIG. 4 stacked between a lens array of multi-lens array module 511 and image sensor 512 in accordance with the teachings of the present invention. As shown in the depicted example, multi-lens array module 511 is adapted to direct a single image 538 onto image sensor 512. In one example, each lens in the lens array included in multi-lens array module 511 is directed to direct the single image 538 onto a respective one of the partitions 514, 516, 518, and 520, respectively, as discussed above in accordance with the teachings of the present invention.

As shown in the depicted example, image sensor 512 includes a two-dimensional (2D) array of pixel cells (e.g., pixels P1, P2, . . . , Pn). Each pixel cell in the pixel array may include a CMOS pixel or a CCD pixel. As illustrated, each pixel cell is arranged into a row (e.g., rows R1 to Ry) and a column (e.g., column C1 to Cx) of the pixel array to acquire image data of a person, place, object, etc., which can then be used to render a 2D image of the person, place, object, etc. In one example, image sensor 512 is a backside illuminated (BSI) image sensor. In one example, image sensor 512 is a frontside illuminated (FSI) image sensor.

After each pixel cell P1, P2, . . . Pn has acquired its image data or image charge, the image data is readout from image sensor 512 through bitlines to readout circuitry 540, which may then be transferred to function logic 542. Readout circuitry 540 may include amplification circuitry, analog-to-digital (ADC) conversion circuitry, or otherwise. Function logic 542 may simply store the image data or even manipulate the image data by applying post image effects (e.g., crop, rotate, remove red eye, adjust brightness, adjust contrast, or otherwise). In one example, readout circuitry 540 may readout a row of image data at a time from image sensor 512, or from each partition 514, 516, 518, and 520, along readout column lines (illustrated) or may readout the image data using a variety of other techniques (not illustrated), such as a serial readout or a full parallel readout of all pixels simultaneously.

Control circuitry 544 is coupled to image sensor 512 to control operational characteristics of pixel array 512. For example, control circuitry 544 may generate a shutter signal for controlling image acquisition. In one example, the shutter signal is a global shutter signal for simultaneously enabling all pixels within image sensor 512 to simultaneously capture their respective image data during a single acquisition window. In an alternative example, the shutter signal is a rolling shutter signal whereby each row, column, group of pixels, or partition is sequentially enabled during consecutive acquisition windows.

It is appreciated that the low profile image capture unit is not limited to a 2×2 lens array, any that size of lens array in multi-lens array module 511 is possible. Accordingly, the image sensor 512 is not limited to four partitioned areas. Any number of partitioned areas is possible. The partitioned areas 514, 516, 518, and 520 of image sensor 512 may be square or rectangular.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An apparatus, comprising:
   an image sensor partitioned into a plurality of image sensor regions, wherein a circuit board and the image sensor are un-integrated components such that the image sensor is attached to the circuit board;
   a lens array including a plurality of lenses disposed proximate to the image sensor, wherein each one of the plurality of lenses is arranged to focus a single image onto a respective one of the plurality of image sensor regions; and
   a spacer structure extending between the lens array and the circuit board to separate the lens array from the image sensor, wherein the spacer structure is bonded directly to the circuit board and surrounds a perimeter around all of the plurality of image sensor regions and the plurality of lenses such that none of the spacer structure is disposed between any of the plurality of lenses and the plurality of image sensor regions of the image sensor.

2. The apparatus of claim 1 wherein the spacer structure is adapted to separate the lens array from the image sensor by a focal length of the plurality of lenses.

3. The apparatus of claim 1 wherein the plurality of lenses include a first lens having a first radius of curvature and positioned a first focal length away from the respective one of the plurality of image sensor regions, a second lens having a second radius of curvature and positioned a second focal length away from the respective one of the plurality of image sensor regions, and a third lens having a third radius of curvature and positioned a third focal length away from the respective one of the plurality of image sensor regions, wherein the first, second and third radii of curvature are different.

4. The apparatus of claim 3 wherein the first radius of curvature corresponds with light having a first color, wherein the second radius of curvature corresponds with light having a second color and wherein the third radius of curvature corresponds with light having a third color.

5. The apparatus of claim 4 wherein the first lens focuses the single image having the first color on the respective one of the N image sensor regions, wherein the second lens focuses the single image having the second color on the respective one of the plurality of image sensor regions, and wherein the third lens focuses the single image having the third color on the respective one of the plurality of image sensor regions.

6. The apparatus of claim 4 further comprising first, second and third color filters proximate to the first, second and third lenses, respectively.

7. The apparatus of claim 1 wherein the plurality of lenses further include a fourth lens having a fourth radius of curvature and positioned a fourth focal length away from the respective one of the plurality of image sensor regions.

8. The apparatus of claim 7 wherein the fourth focal length corresponds with white light.

9. The apparatus of claim 7 wherein the fourth focal length corresponds with green light.

10. An imaging system, comprising:
    a pixel array including an image sensor partitioned into a plurality of image sensor regions, wherein each one of the plurality of image sensor regions has a plurality of pixels arranged therein, and wherein a circuit board and the image sensor are un-integrated components such that the image sensor is attached to the circuit board;
    a lens array including a plurality of lenses disposed proximate to the image sensor, wherein each one of the plurality of lenses is arranged to focus a single image onto a respective one of the plurality of image sensor regions;
    a spacer structure extending between the lens array and the circuit board to separate the lens array from the image sensor, wherein the spacer structure is bonded directly to the circuit boards and surrounds a perimeter around all of the plurality of image sensor regions and the plurality of lenses such that none of the spacer structure is disposed between any of the plurality of lenses and the plurality of image sensor regions of the image sensor;
    control circuitry coupled to the pixel array to control operation of the pixel array; and
    readout circuitry coupled to the pixel array to readout single image data from the plurality of pixels.

11. The imaging system of claim 10 further comprising function logic coupled to the readout circuitry to store the single image data readout from each one of the plurality of image sensor regions.

12. The imaging system of claim 10 wherein the spacer structure is adapted to separate the lens array from the image sensor by a focal length of the plurality of lenses.

13. The imaging system of claim 10 wherein the plurality of lenses include a first lens having a first radius of curvature and positioned a first focal length away from the respective one of the plurality of image sensor regions, a second lens having a second radius of curvature and positioned a second focal length away from the respective one of the plurality of image sensor regions, and a third lens having a third radius of curvature and positioned a third focal length away from the respective one of the plurality of image sensor regions, wherein the first, second and third radii of curvature are different.

14. The imaging system of claim 13 wherein the first radius of curvature corresponds with light having a first color, wherein the second radius of curvature corresponds with light having a second color and wherein the third radius of curvature corresponds with light having a third color.

15. The imaging system of claim 14 wherein the first lens focuses the single image having the first color on the respective one of the plurality of image sensor regions, wherein the second lens focuses the single image having the second color on the respective one of the plurality of image sensor regions, and wherein the third lens focuses the single image having the third color on the respective one of the plurality of image sensor regions.

16. The imaging system of claim 14 further comprising first, second and third color filters proximate to the first, second and third lenses, respectively.

17. The imaging system of claim 10 wherein the plurality of lenses further include a fourth lens having a fourth radius of curvature and positioned a fourth focal length away from the respective one of the plurality of image sensor regions.

18. The imaging system of claim 17 wherein the fourth focal length corresponds with white light.

* * * * *